United States Patent [19]

Kim et al.

[11] Patent Number: 5,352,621
[45] Date of Patent: Oct. 4, 1994

[54] METHOD FOR MANUFACTURING AN INTERNALLY SHIELDED DYNAMIC RANDOM ACCESS MEMORY CELL

[75] Inventors: Jae-Kap Kim; In-Sool Chung, both of Kyoungki-do, Rep. of Korea

[73] Assignee: Hyundai Electronics Industries Co. Ltd, Kyoungki-Do, Rep. of Korea

[21] Appl. No.: 46,201

[22] Filed: Apr. 14, 1993

[30] Foreign Application Priority Data

Apr. 17, 1992 [KR] Rep. of Korea ............... 92-6456

[51] Int. Cl.$^5$ ............................................. H01L 21/70
[52] U.S. Cl. ............................................ 437/52; 437/60; 437/919
[58] Field of Search ............... 437/44, 52, 47, 48, 437/60, 919

[56] References Cited

U.S. PATENT DOCUMENTS 5,114,873 5/1992 Kim et al. .................... 437/52
5,140,389 8/1992 Kimura et al. ................ 257/309

Primary Examiner—George Fourson
Assistant Examiner—H. Jey Tsai
Attorney, Agent, or Firm—Morgan & Finnegan

[57] ABSTRACT

In the manufacturing process of a Dynamic Random Access Memory cell, the conducting layer used for preventing the capacitive coupling between a bit line and a word line is formed over the surface of the entire memory cell excepting the contact legion of a bit line and a storage electrode. Moreover, as the conducting layer used for preventing the capacitive coupling is used as an etching barrier in the etching process forming a contact hole, self-aligned contacts are formed. Therefore, the operation of the unwanted cell of a Dynamic Random Access Memory cell caused by the capacitive coupling is protected and a highly integrated Dynamic Random Access Memory cell is manufactured.

6 Claims, 5 Drawing Sheets

METHOD FOR MANUFACTURING AN INTERNALLY SHIELDED DYNAMIC RANDOM ACCESS MEMORY CELL

BACKGROUND OF THE INVENTION

1. Field of the Invention

This invention relates to a Dynamic Random Access Memory cell and a method for its manufacture, and more particularly to a Dynamic Random Access Memory cell having a conducting layer located between a bit line and a word line for preventing the capacitive coupling occurred by the signal applied to the bit line and the word line and having self-aligned contacts, and a method for its manufacture.

2. Related Art

In a bit line shielded capacitor cell in which a bit line is formed between a word line and a stacked capacitor, if the transient signal is applied to the word line during the operation of the cell, the potential of the adjacent bit line is affected by the capacitive coupling of the word line and the bit line. Therefore, it may result in the operation of the unwanted cell. Also, when the transient signal is applied to the bit line, the adjacent word line is also affected by the capacitive coupling of the word line and the bit line.

Also, in the manufacturing process of a Dynamic Random Access Memory cell, the bit line and the storage electrode are electrically coupled to the source and drain of a MOSFET, respectively, but they are electrically isolated from the word line.

Accordingly, for isolating the word line from the contacts, the layout should be made according to the design rule considering the critical dimension variation, misalignment tolerance and the thickness of the insulating layer.

However, when a Dynamic Random Access Memory cell is formed by self-aligned contacts according to the conventional method, high topology is formed so that the pattern of the conducting layer and insulating layer is not completely formed at the sidewall of the high topology during the patterning process of the conducting layer and insulating layer.

SUMMARY OF THE INVENTION

It is therefore an object of the invention to provide a process for manufacturing a Dynamic Random Access Memory cell having a conducting layer used for preventing the capacitive coupling of the word line and the bit line.

It is another object to provide a process for manufacturing a Dynamic Random Access Memory cell having the even insulating layer on the surface of the conducting layer used for preventing the capacitive coupling of the word line and the bit line in order to reduce the formation of high topology occurred by self-aligned contacts.

It is also another object to provide a process for manufacturing a Dynamic Random Access Memory cell employing the conducting layer used for preventing the capacitive coupling of the word line and the bit line as an etching layer during the process for forming a contact hole.

To achieve the above-described objects of the invention, a Dynamic Random Access Memory cell will comprise of an insulating layer formed on a word line, a conducting layer formed on the insulating layer for preventing the capacitive coupling of the word line and the bit line, the insulating layer formed on the conducting layer and a bit line formed on the insulating layer.

Also, to manufacture a Dynamic Random Access Memory cell according to the present invention, a word line electrically isolated from a silicon substrate is vertically formed and the first insulating layer is then formed on the word line. Thereafter, a conducting layer used for preventing the capacitive coupling of the word line and the bit line is formed on said first insulating layer and a second insulating layer used for forming an even surface is then formed on the conducting layer. Finally, a bit line electrically isolated from the conducting layer and electrically coupled to the predetermined region of the silicon substrate is horizontally formed. Therefore, the potential of the word line is not affected by the transient signal applied to the bit line.

Also, to manufacture a Dynamic Random Access Memory cell according to the present invention, a field oxide layer in the non-active region of a silicon substrate is formed and a MOSFET having a gate oxide layer, a word line and a source/drain is then formed. Thereafter, a first insulating layer is formed over the entire surface and a conducting layer used for preventing the capacitive coupling of the word line and the bit line and a second insulating layer used for forming an even surface are formed on said first insulating layer.

After the second insulating layer, the conducting layer and the first insulating layer in the region of a bit line contact are continually etched until the source of the MOSFET is exposed, and then a contact hole is formed. Thereafter, an insulating spacer is formed on the sidewall of the exposed conducting layer and a bit line electrically coupled to the source is then formed.

As the next process, a third insulating layer used for forming an even surface is formed over the entire surface and a contact hole is formed by continually etching the third insulating layer, the second insulating layer, the conducting layer and the first insulating layer in the contact region of a storage electrode until the drain is exposed. After the etching process, an insulating spacer is formed on the sidewall of the exposed conducting layer and a storage electrode electrically coupled to the drain is finally formed.

In the above description of a Dynamic Random Access Memory cell and a method for manufacturing the same, the conducting layer used for preventing the capacitive coupling of the word line and the bit line is formed over the entire memory cell excepting the contact region of a bit line and a storage electrode so that the occurrence of the capacitive coupling of the bit line and the word line is prevented. Moreover, as the conducting layer used for preventing the capacitive coupling is used as a etching barrier during the etching process forming a contact hole, self-aligned contacts are formed. Therefore, the operation of the unwanted cell of a Dynamic Random Access Memory cell caused by the capacitive coupling is not performed and a highly integrated Dynamic Random Access Memory cell is manufactured.

BRIEF DESCRIPTION OF THE DRAWINGS

For fuller understanding of the nature and objects of the invention, reference should be had to the following detailed description taken in conjunction with the accompanying drawings in which.

DESCRIPTION OF THE PREFERRED EMBODIMENTS

Figure 1:
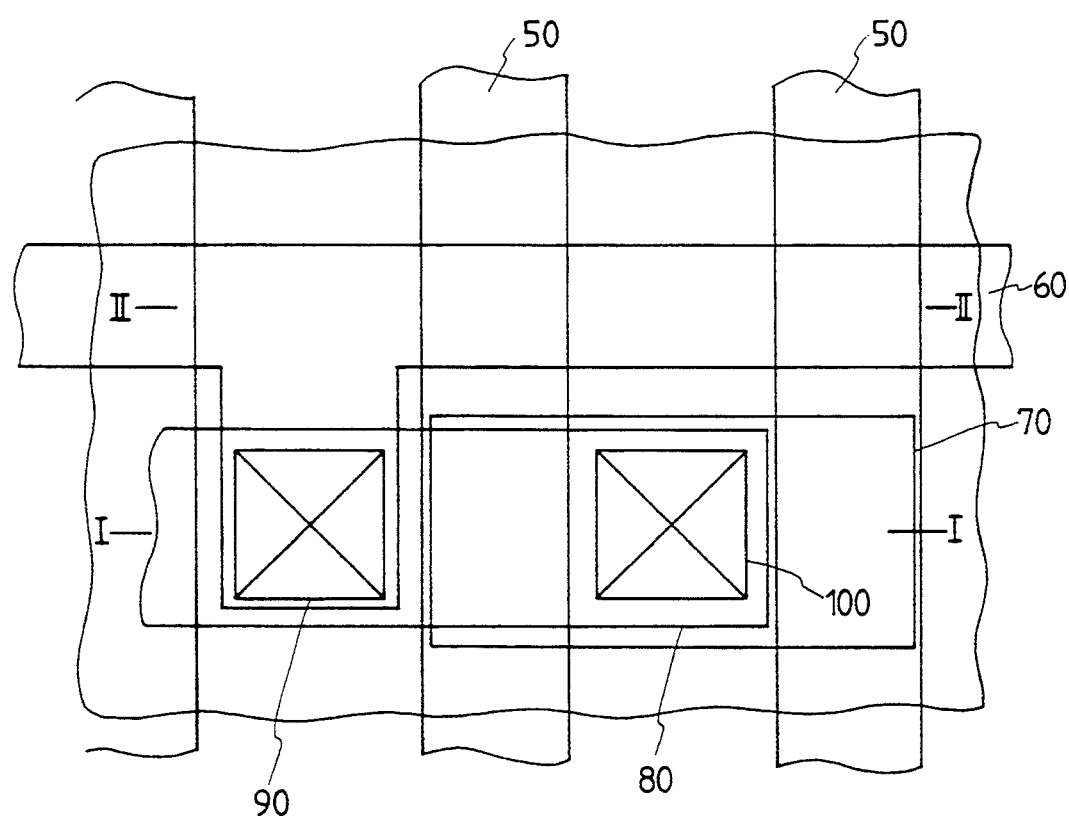
FIG. 1 is a plan view for the layout of a Dynamic Random Access Memory cell according to the present invention.

The novel feature of the present invention may be understood from the accompanying description when taken in conjunction with the accompanying drawings where similar reference characters refer to similar parts throughout several views of the drawing.

FIG. 1 is a plan view for the layout of a Dynamic Random Access Memory cell according to the present invention. Referring to FIG. 1, a plurality of word lines 50 and a plurality of bit lines 60 are each vertically and horizontally arrayed in the non-active region, respectively. In the active region 80, a storage electrode 70 and a storage electrode contact 100 are arrayed and a bit line contact 90 is also arrayed.

FIG. 2A through FIG. 2G are cross-sectional views illustrating processes for manufacturing a Dynamic Random Access Memory cell according to I—I of the layout shown in FIG. 1.

Figure 2A:
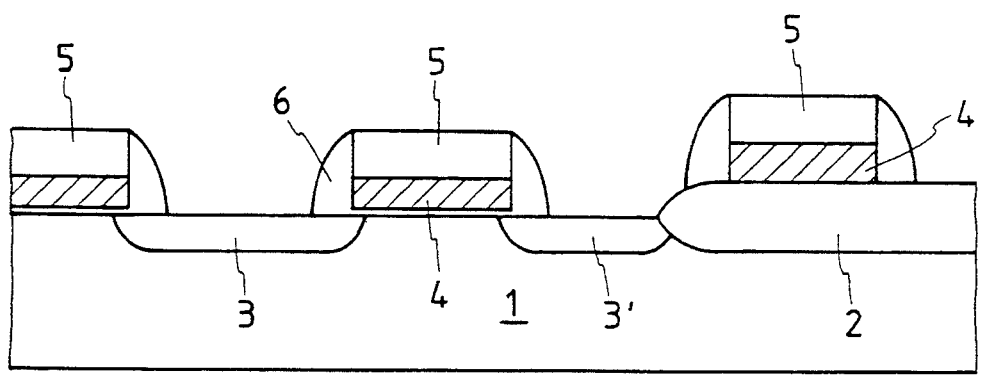
FIG. 2A through 2G are cross-sectional views illustrating processes for manufacturing a Dynamic Random Access Memory cell according to I—I of the layout shown in FIG. 1.

As shown in FIG. 2A, a field oxide layer 2 is formed at the predetermined region of a silicon substrate 1 and a plurality of word lines 4 are formed. Thereafter, an insulating layer 5 used as a mask is formed on the word line 4 and an insulating spacer 6 is formed on the sidewall of the word line 4. After that, a source 3 and a drain 3' are formed by injecting impurities on the silicon substrate 1 of the active region.

Figure 2B:
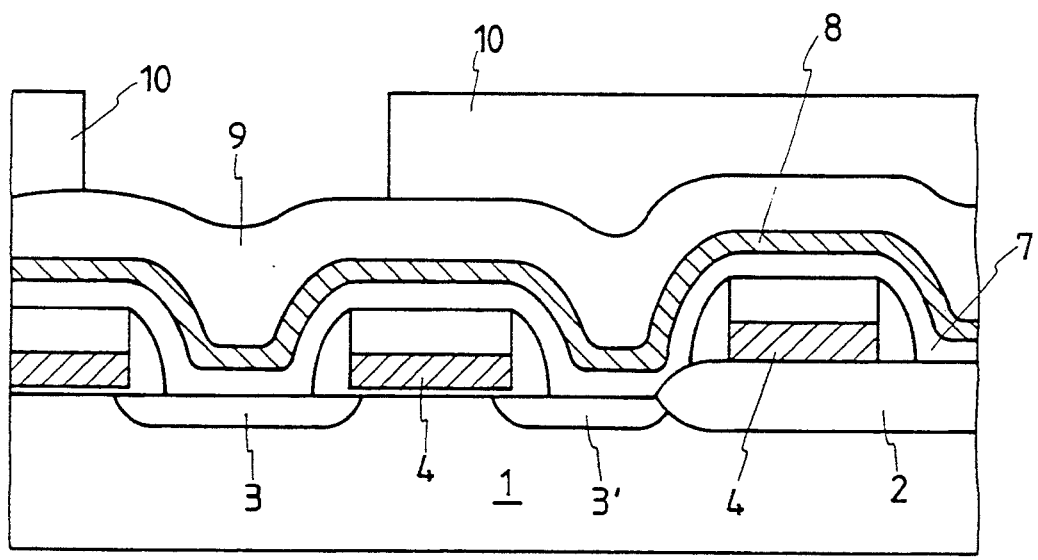

Referring to FIG. 2B, the first insulating layer 7, comprising of an Oxide layer, is formed over the entire surface and a conducting layer 8, comprising of a silicon layer or a metal layer, used for preventing capacitive coupling of the word line and the bit line is deposited on the first insulating layer 7. Thereafter, the second insulating layer 9, comprising of a Boro-Phospho-Silicate-Glass layer or a Undoped-Silicate-Glass layer, used for forming an even surface is formed on the conducting layer 8 and a photoresist pattern 10 used as a mask for forming a contact of the bit line is formed on the second insulating layer 9.

Figure 2C:
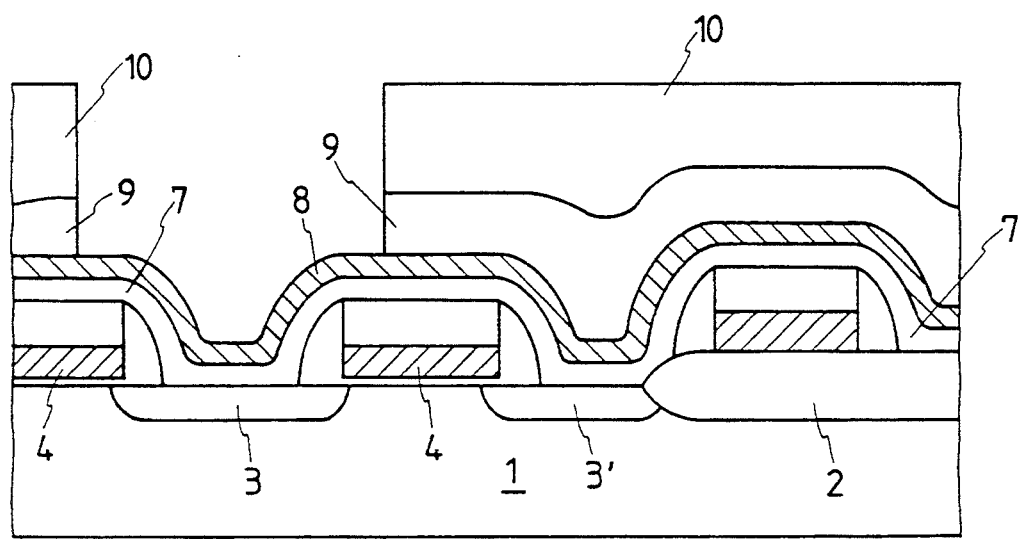

As shown in FIG. 2C, the second insulating layer 9 is etched by the etching process employing the photoresist pattern 10 as a mask.

Figure 2D:
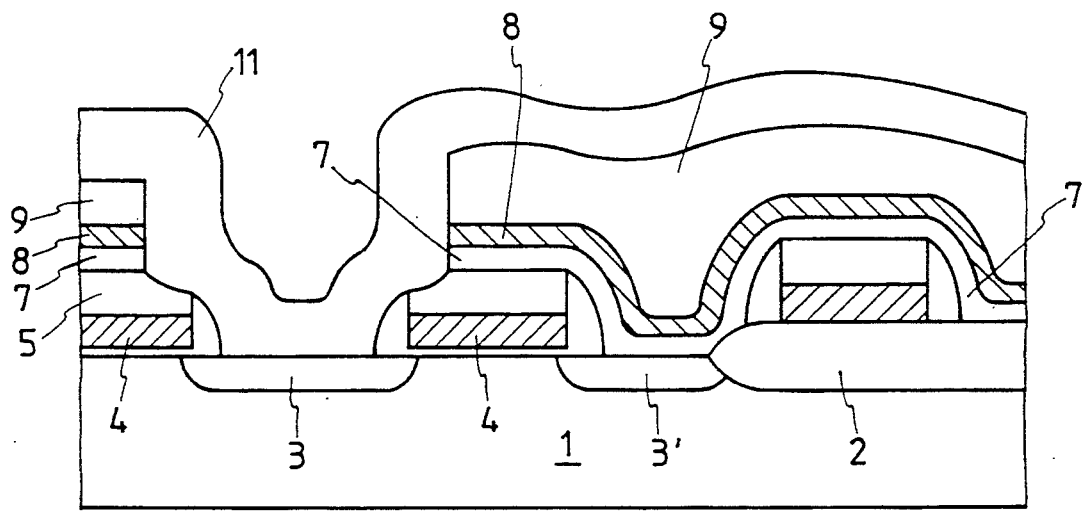

As shown in FIG. 2D, a contact hole is formed by etching the conducting layer 8 and the first insulating layer 7 until the source 3 is exposed after the second insulating layer 9 is etched, and the photoresist pattern 10 is then removed. Thereafter, an insulating layer 11 used as a spacer is formed over the entire surface.

Figure 2E:
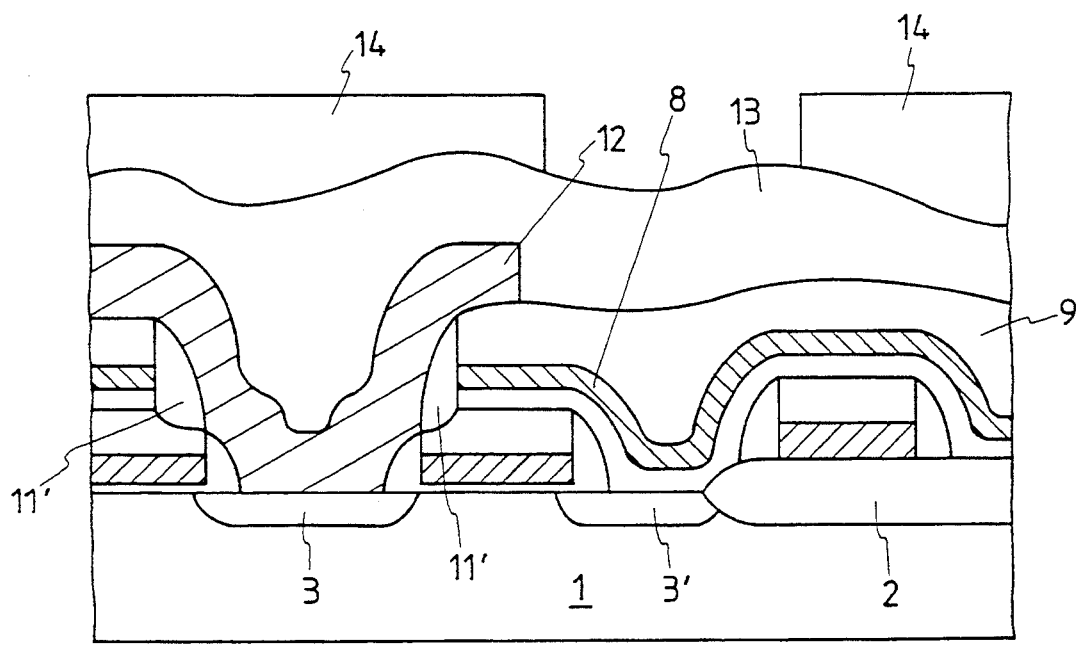

Referring to FIG. 2E, after an insulating spacer 11' is formed on the sidewall of the conducting layer 8 used for preventing capacitive coupling of the contact hole of the bit line 12 by anisotropically etching the insulating layer 11 used as a spacer, a bit line 12 electrically coupled to the source 3 is formed. Thereafter, the third insulating layer 13, comprising of a Boro-Phospho-Silicate-Glass layer or a Undoped-Silicate-Glass layer, used for forming an even surface is formed and a photoresist pattern 14 used as a contact mask of the storage electrode is formed on the third insulating layer 13.

Figure 2F:
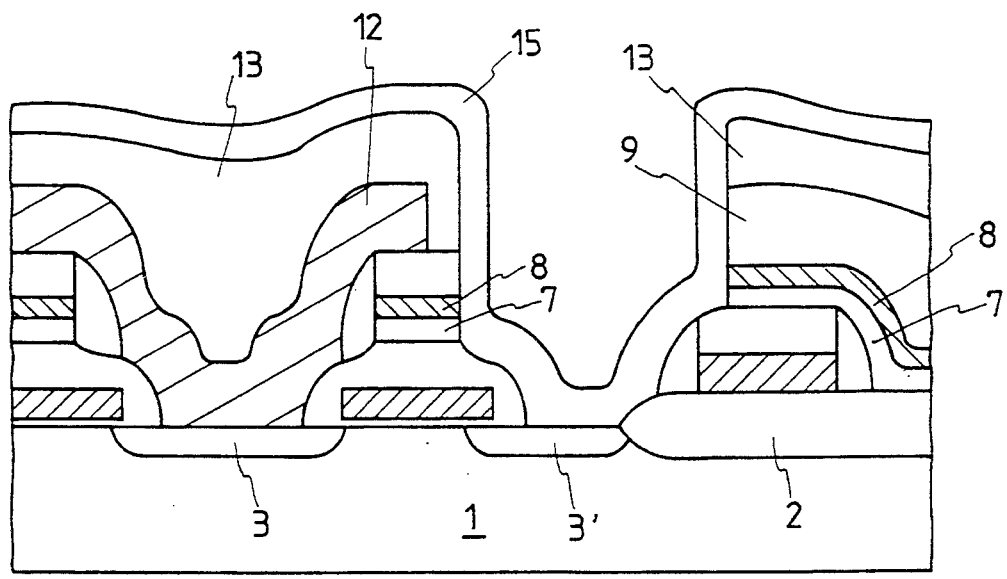

As shown in FIG. 2F, the third insulating layer 13, the second insulating layer 12, the conducting layer 8 and the first insulating layer 7 are continually etched out by the etching process employing the photoresist pattern 14 as a mask until the drain 3' is exposed so that a contact hole used as the storage electrode is formed. Thereafter, the photoresist pattern 14 is removed and an insulating layer 15 used as a spacer is formed over the entire surface.

Figure 2G:
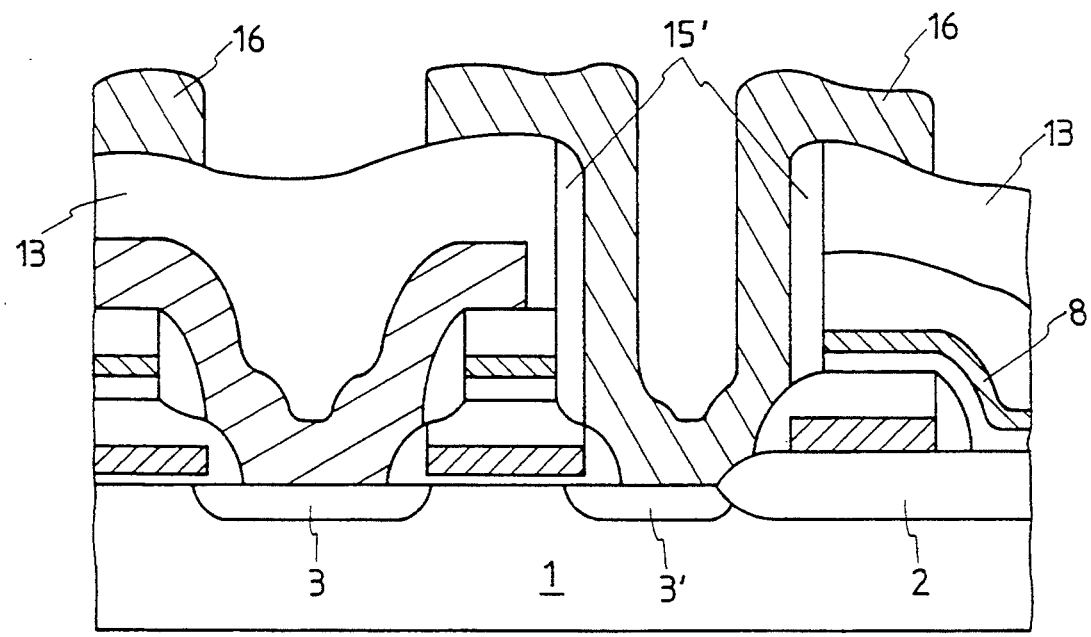

Referring to FIG. 2G, an insulating spacer 15' is formed at the sidewall of the contact hole used as the storage electrode by anisotropically etching the insulating layer 15 used on a spacer. As formed in the common process, a capacitor dielectric film and a plate electrode are formed on the storage electrode in this process.

Figure 3:
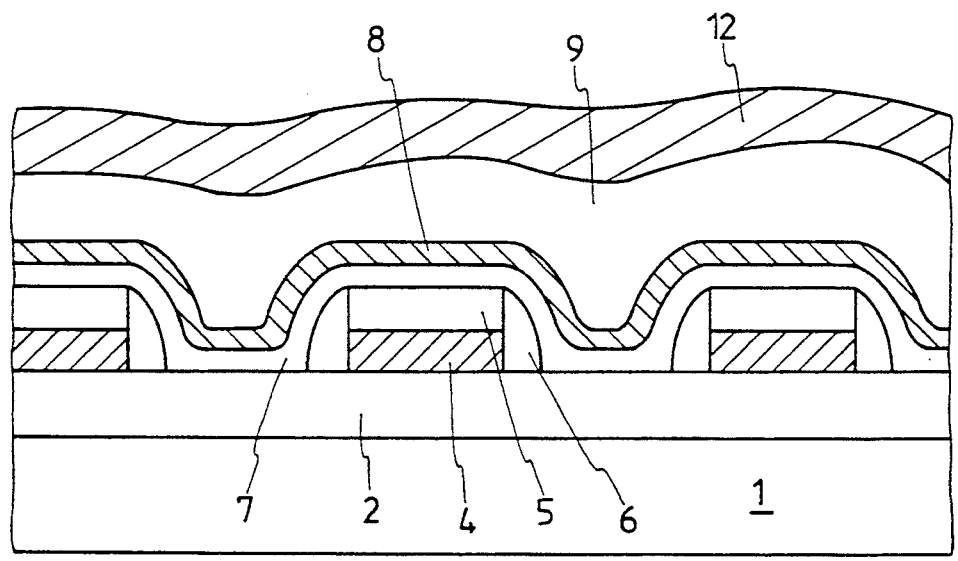
FIG. 3 is a cross-sectional view illustrating the formation a Dynamic Random Access Memory cell according to II—II of the layout shown in FIG. 1.

FIG. 3 is a cross-sectional view illustrating the formation of a Dynamic Random Access Memory cell according to II—II of the layout shown in FIG. 1. As shown in FIG. 3, a field oxide layer 2 is formed on a silicon substrate 1 and word line 4, and an insulating layer 5 used as a mask and an insulating spacer 6 are then formed. Thereafter, the first insulating layer 7, the conducting layer 8 used for preventing capacitive coupling, the second insulating layer 9 and a bit line 12 is continually formed.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit any scope of the invention.

What is claimed is:

1. A method for manufacturing an internally shielded Dynamic Random Access Memory cell comprising the steps of:

forming vertically a word line conductively isolated from a silicon substrate;

forming a first insulating layer on said word line;

forming an electrically conducting layer used for preventing the capacitive coupling of said word line and a bit line on said first insulating layer, said conducting layer being conductively isolated from said word line;

forming a second insulating layer used for forming an even surface on said conducting layer;

forming horizontally said bit line conductively isolated from said conducting layer and electrically coupled to a section of said silicon substrate the conductivity of which depends upon a voltage applied to said word line; and forming a storage electrode electrically coupled to said section of said silicon substrate, said storage electrode being conductively isolated from said conducting layer.

2. A method for manufacturing a Dynamic Random Access Memory cell claimed in claim 1, wherein said bit line is vertically formed in an active region and between said active regions.

3. A method for manufacturing a Dynamic Random Access Memory cell claimed in claim 2, wherein said conducting layer is formed by a silicon layer or a metal layer.

4. A method for manufacturing an internally shielded Dynamic Random Access Memory cell comprising the steps of:

- forming a field oxide layer in the non-active region of a silicon substrate;
- forming a MOSFET having a gate oxide layer, a word line and a source/drain;
- forming a first insulating layer over the entire surface;
- forming an electrically conducting layer used for preventing the capacitive coupling of said word line and a bit line and a second insulating layer used for forming an even surface on said first insulating layer, said conducting layer being conductively isolated from said word line;
- forming a contact hole by etching said second insulating layer, said conducting layer and said first insulating layer in the region of a bit line contact until said source of said MOSFET is exposed;
- forming an insulating spacer on the sidewall of said exposed conducting layer;
- forming said bit line electrically coupled to said source, said bit line being conductively isolated from said conducting layer;
- forming a third insulating layer used for forming an even surface over the entire surface;
- forming a contact hole by etching said third insulating layer, said second insulating layer, said conducting layer and said first insulating layer in the contact region of a storage electrode until said drain is exposed;
- forming an insulating spacer on the sidewall of said exposed conducting layer; and
- forming a storage electrode electrically coupled to said drain, said storage electrode being conductively isolated from said conducting layer.

5. A method for manufacturing a Dynamic Random Access Memory cell claimed in claim 4, wherein said conducting layer used for preventing the capacitive coupling of said word line and said bit line is formed by a silicon layer or a metal layer.

6. A method for manufacturing a Dynamic Random Access Memory cell claimed in claim 5, wherein said second insulating layer and said third insulating layer are made of Boro-Phospho-silicate-glass or undoped-silicate-glass.

* * * * *